United States Patent
Hsieh et al.

(10) Patent No.: US 10,615,768 B2
(45) Date of Patent: Apr. 7, 2020

(54) PROBE ASSEMBLY AND CAPACITIVE SPACE TRANSFORMER THEREOF

(71) Applicant: CHUNGHWA PRECISION TEST TECH. CO., LTD., Taoyuan (TW)

(72) Inventors: Chih-Peng Hsieh, Taipei (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 209 days.

(21) Appl. No.: 15/853,792

(22) Filed: Dec. 23, 2017

(65) Prior Publication Data

US 2019/0103850 A1    Apr. 4, 2019

(30) Foreign Application Priority Data

Sep. 29, 2017   (TW) .............................. 106133737 A

(51) Int. Cl.
*H03H 7/38*      (2006.01)
*G01R 1/073*     (2006.01)
*G01R 1/067*     (2006.01)

(52) U.S. Cl.
CPC ........... *H03H 7/38* (2013.01); *G01R 1/06711* (2013.01); *G01R 1/07342* (2013.01); *G01R 1/06755* (2013.01)

(58) Field of Classification Search
CPC .. H03H 7/38; G01R 1/06711; G01R 1/07342; G01R 1/07307; G01R 1/07385; G01R 1/36; G01R 3/00; G01R 31/2601; G01R 31/2889

USPC .......................... 324/754.07, 754.03, 755.11
See application file for complete search history.

(56) References Cited

U.S. PATENT DOCUMENTS

| | | | |
|---|---|---|---|
| 7,057,410 B1* | 6/2006 | Wohlfarth .......... | G01R 31/2889 324/750.25 |
| 9,267,968 B2* | 2/2016 | Brandorff .......... | G01R 1/07342 |
| 2002/0014004 A1* | 2/2002 | Beaman ............ | G01R 1/07307 29/842 |
| 2006/0280752 A1* | 12/2006 | BenMohamed ..... | A61K 39/245 424/186.1 |
| 2008/0143353 A1* | 6/2008 | Yokota ................... | G01R 27/00 324/715 |
| 2010/0062629 A1* | 3/2010 | Feldman ............ | G01R 31/2889 439/219 |
| 2014/0091826 A1* | 4/2014 | Chui .................. | G01R 1/07378 324/756.03 |

* cited by examiner

*Primary Examiner* — Jermele M Hollington
*Assistant Examiner* — Robert P Alejnikov, Jr.
(74) *Attorney, Agent, or Firm* — Li & Cai Intellectual Property (USA) Office

(57) ABSTRACT

The instant disclosure provides a probe assembly and a capacitive space transformer thereof. The probe assembly includes a space transformer and a plurality of probe structures. The space transformer includes a transfer board and a plurality of dielectric structures. The transfer board includes a plurality of conductive portions. Each of the dielectric structures is disposed on one side of the corresponding conductive portion and contacts the corresponding conductive portion. Each of the dielectric structures is disposed between the corresponding conductive portion and the corresponding probe structure. The probe structure includes a first end portion, a second portion, and a connecting portion connected between the first and second end portions.

11 Claims, 10 Drawing Sheets

PROBE ASSEMBLY AND CAPACITIVE SPACE TRANSFORMER THEREOF

BACKGROUND

1. Technical Field

The instant disclosure relates to a probe assembly and a capacitive space transformer thereof, and in particular, to a probe assembly and a capacitive space transformer thereof for a probe card of a chip.

2. Description of Related Art

When performing high-speed signal tests, the core power of a conventional System on Chip (SoC) often has a target impedance value at the used frequency point that is too high. Such a problem may be related to the probe card, the transfer substrate, the probe seat or the chip probe. Therefore, the existing solution mostly focuses on the optimization of the transfer substrate, i.e., using a suitable number of decouple capacitors to improve the target impedance value of the power delivery network (PDN). However, even if such an approach can allow the transfer substrate to have a desired impedance value, the distance between the transfer substrate and the end to be measured is too large and hence, the overall power delivery network cannot be effectively controlled.

Therefore, there is a need to provide a probe assembly and a capacitive probe thereof which are able to reduce the power impedance at the resonant frequency point while performing application tests of the high speed system on chip and to increase the performance of the power delivery network for overcoming the above disadvantages.

SUMMARY

An exemplary embodiment of the present disclosure provides a probe assembly and a capacitive space transformer thereof for effectively reducing the power impedance of the resonant frequency point and increasing the performance of the power delivery network.

An embodiment of the instant disclosure provides a probe assembly including a space transformer and a plurality of probe structures. The space transformer includes a transfer board and a plurality of dielectric structures, in which the transfer board has a plurality of conductive portions, and each of the dielectric structures is disposed on one side of the conductive portion corresponding thereto and contacting the conductive portion corresponding thereto. Each of the plurality of probe structures is disposed at one side of the dielectric structure corresponding thereto and contacting the dielectric structure corresponding thereto. Each of the dielectric structures is disposed between the conductive portion corresponding thereto and the probe structure corresponding thereto. Each of the probe structures has a first end portion, a second end portion corresponding to the first end portion, and a connecting portion connected between the first end portion and a second end portion.

Another embodiment of the instant disclosure provides a space transformer. A plurality of probe structures is respectively and electrically connected to the space transformer. The space transformer includes a transfer board having a plurality of conductive portions and a plurality of dielectric structures disposed in the plurality of conductive portions. Each of the dielectric structures is located between the conductive portion corresponding thereto and the probe structure corresponding thereto.

The advantage of the instant disclosure resides in that the probe assembly and the space transformer thereof can optimize the target impedance value and increase the performance of the power delivery network based on the technical feature of "each of the dielectric structures is disposed between the conductive portion corresponding thereto and the probe structure corresponding thereto".

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
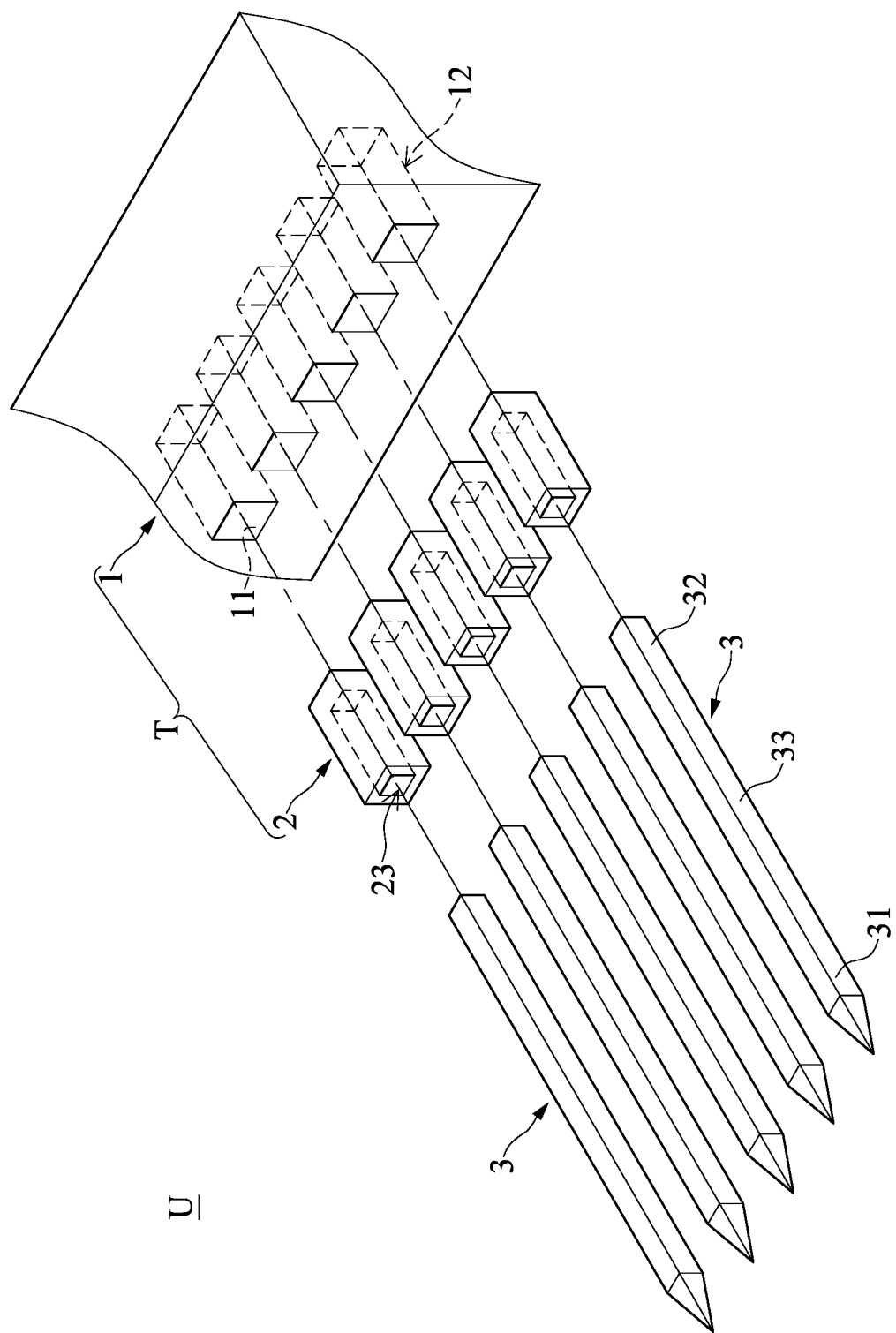
FIG. 1 is an exploded perspective view of a probe assembly of a first embodiment of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

It is noted that the term "first" and "second" for describing different elements or signals are only used to distinguish these elements/signals from one another rather than limiting the nature thereof. In addition, the term "or" used in the specification may include one or more of the listed items.

First Embodiment

Figure 2:
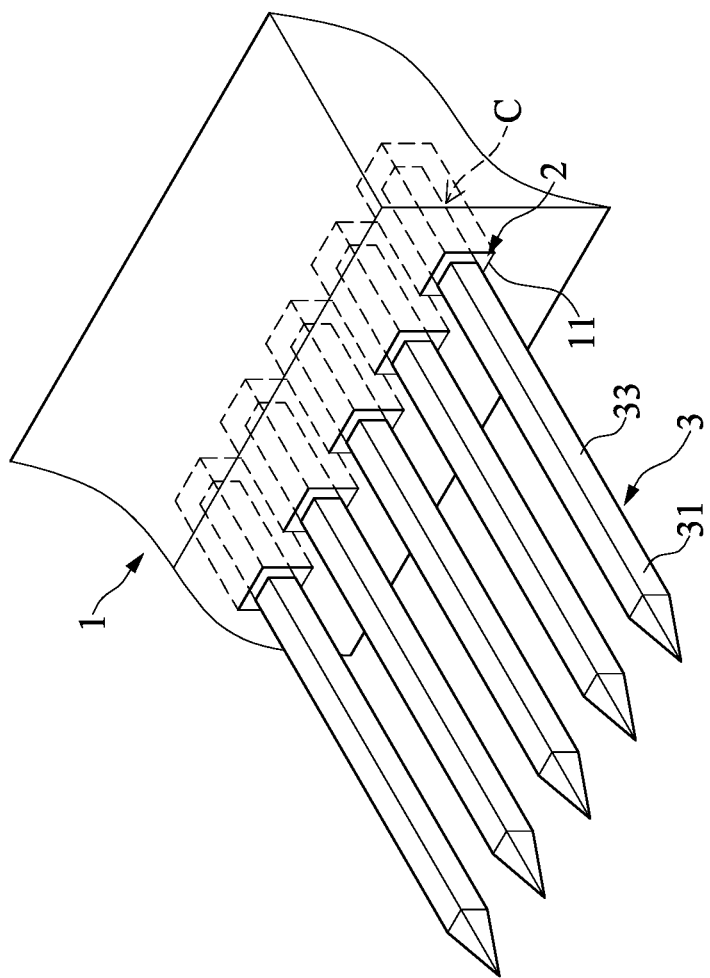
FIG. 2 is an assembly perspective view of the probe assembly of the first embodiment of the instant disclosure.
Figure 3:
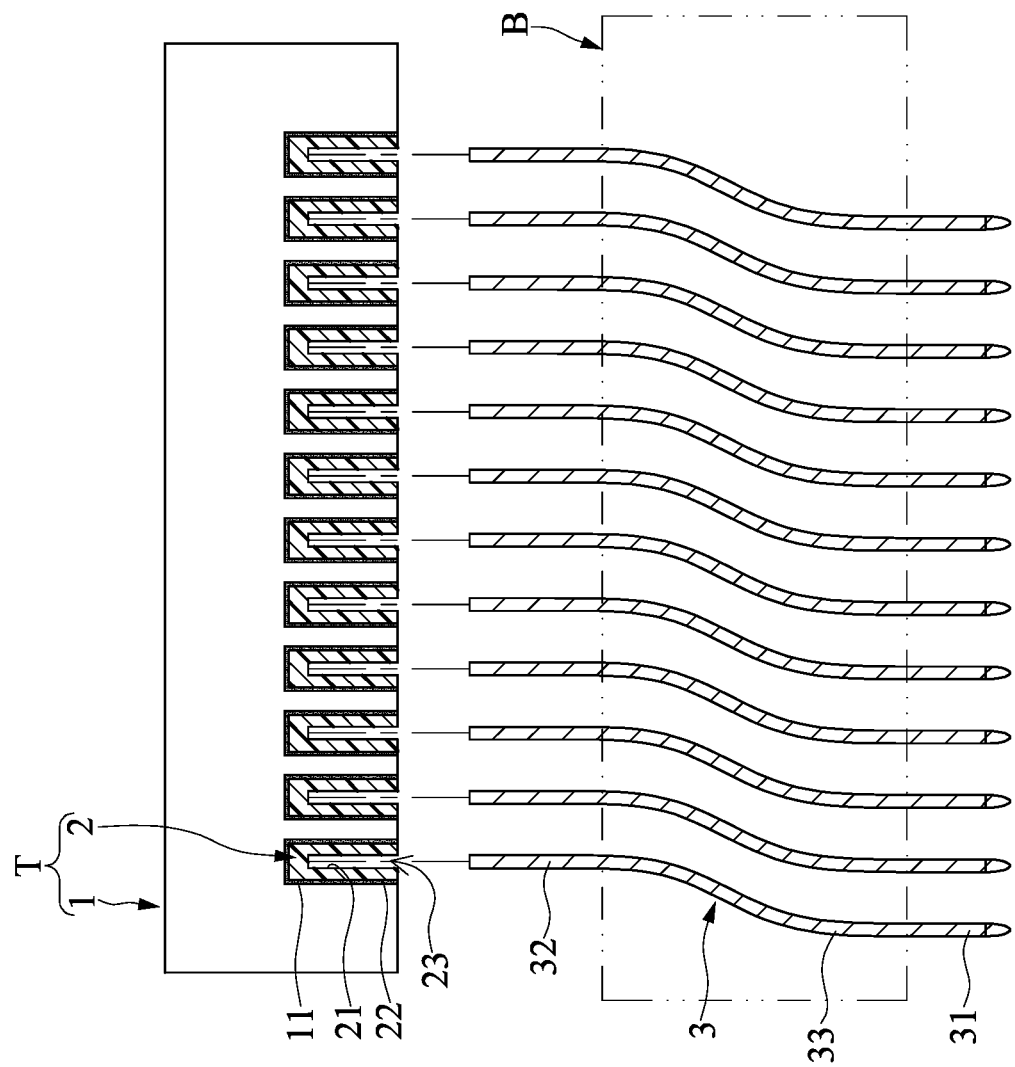
FIG. 3 is a schematic cross-sectional view of the probe assembly of the first embodiment of the instant disclosure.
Figure 4:
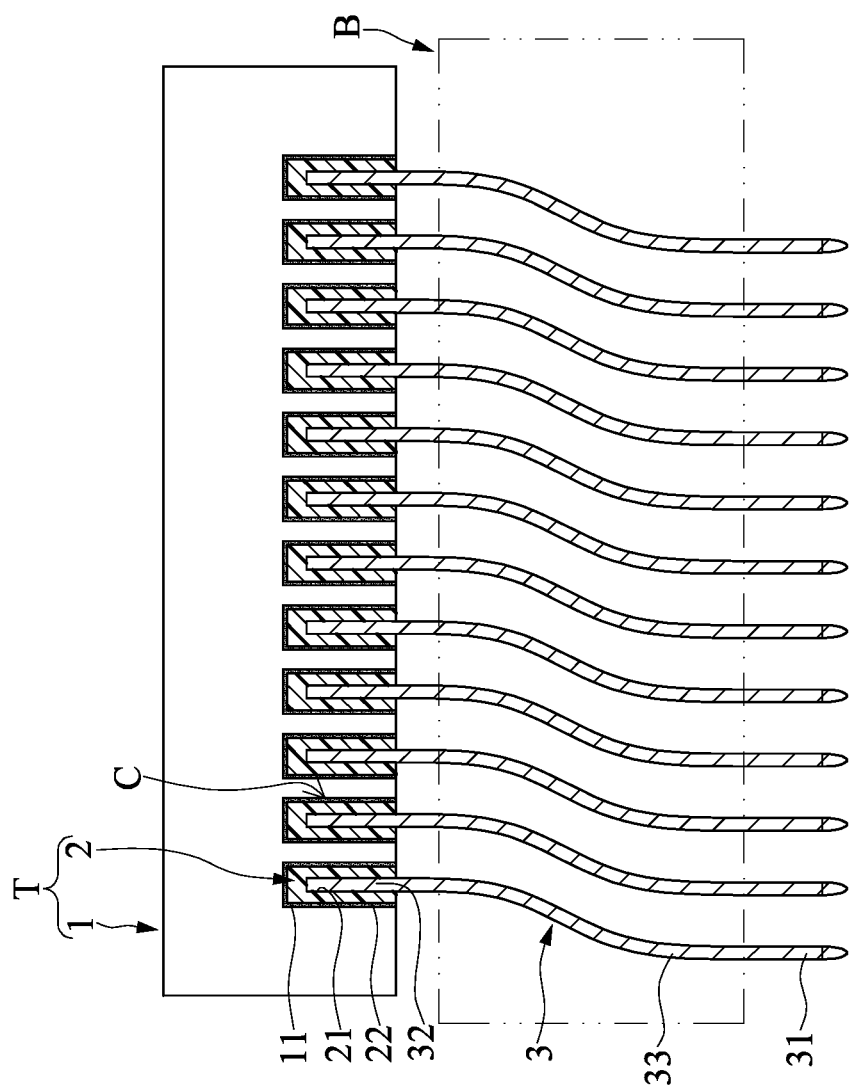
FIG. 4 is another schematic cross-sectional view of the probe assembly of the first embodiment of the instant disclosure.

Reference is made to FIG. 1 to FIG. 4. FIG. 1 and FIG. 2 are perspective views of the probe assembly U of the first embodiment, and FIG. 3 and FIG. 4 are sectional side schematic views of the probe assembly U of the first embodiment. The instant disclosure provides a probe assembly U and a space transformer T thereof. The main structure of the probe assembly U is described in the following, and the main structure of the space transformer T will be described later.

The probe assembly U can include a space transformer T and a plurality of probe structures 3. The space transformer T can include a transfer board 1 and a plurality of dielectric structures 2. The transfer board 1 can include a plurality of conductive portions 11. In the embodiments of the instant disclosure, the conductive portion 11 can be located in an accommodating groove 12 of the transfer board 1, i.e., a part of the accommodating groove 12 can be conductive and referred to as the conductive portion 11. However, in other embodiments, the plurality of conductive portions 11 can be disposed in the plurality of accommodating grooves 12 respectively as individual components. The instant disclosure is not limited thereto. For example, in FIG. 3 and FIG. 4, the conductive portions 11 are disposed in the accommodating grooves 12 of the transfer board 1. In addition, the plurality of dielectric structures 2 can be disposed at one side of the plurality of conductive portions 11 and contact with the plurality of conductive portions 11 respectively. In the implementations shown in FIG. 1 to FIG. 4, each of the dielectric structures 2 can be disposed in each of the accommodating grooves 12 of the transfer board 1 and be in contact with the conductive portions 11. It should be noted that the resistivity of the conductive portion 11 of the transfer board 1 can be less than $5 \times 10^2$ Ωm, and the material of the conductive portion 11 can include but not limited to: gold (Au), silver (Ag), copper (Cu), nickel (Ni), cobalt (Co) and the alloys thereof. For example, the conductive portions 11 can be a composite metal material having conductivity, such as a palladium-nickel alloy, a nickel-cobalt alloy, a nickel-magnesium alloy, a nickel-tungsten alloy, a nickel-phosphor alloy or a palladium-cobalt alloy. The instant disclosure is not limited thereto.

Referring to FIG. 3 and FIG. 4, the plurality of probe structures 3 can be disposed at one side of the plurality of dielectric structures 2 and be in contact with the plurality of dielectric structures 2 respectively. Each of the dielectric structures 2 can be disposed between each of the conductive portions 11 and each of the probe structures 3. In other words, each of the probe structures 3 can be disposed at one side of the corresponding dielectric structure 2 and contact with the corresponding dielectric structure 2, and each of the dielectric structures 2 can be disposed between the corresponding conductive portions 11 and the corresponding probe structures 3. In addition, each of the probe structures 3 has a first end portion 31, a second end portion 32 corresponding to the first end portion 31 and a connecting portion 33 connected between the first end portion 31 and the second end portion 32. For example, the first end portion 31 of the probe structure 3 can be in a shape of a pointed needle for breaking the oxidation layer on the surface of a tin ball (the object to be measured). However, in other embodiments, the first end portion 31 of the probe structure 3 can have a flat surface. The instant disclosure is not limited thereto. In addition, the second portion 32 can be a needle tail of the probe structure 3 for being connected to the contacting end of the transfer board 1. In other words, the second end portion 32 of the probe structure 3 can be disposed at one side of the dielectric structures 2 and be in contact with the dielectric structures 2. Meanwhile, in the implementations shown in FIG. 1 to FIG. 4, the second portion 32 of the probe structure 3 can be disposed in the accommodating groove 12 of the transfer board 1, and the shape of the accommodating groove 12 of the transfer board 1 can be a sleeve-like structure. However, the instant disclosure is not limited thereto. In addition, for example, each of the plurality of dielectric structures 2 can have an accommodating space 23, and the second end portion 32 of each of the probe structures can be disposed in the accommodating space 23 of the corresponding dielectric structure 2.

It should be noted that although the probe structures 3 shown in the figures are depicted as rectangular columns, the instant disclosure is not limited thereto. In other implementations, the probe structure 3 can have a cylinder shape or other shapes. Furthermore, it should be noted that although the probe structures 3 are depicted as linear structures in the perspective views, the probe structure 3 can have a curved shape as shown in the sectional schematic views. In addition, since the probe structure 3 is made of conductive material and has conductivity, the resistivity of the probe structure 3 can be less than $5 \times 10^2$ Ωm. The material of the probe structure 3 can include but not limited to: gold (Au), silver (Ag), copper (Cu), nickel (Ni), cobalt (Co) or the alloy thereof. Preferably, the probe structure 3 can be a composite metal material having conductivity; for example, a palladium-nickel alloy, a nickel-cobalt alloy, a nickel-magnesium alloy, a nickel-tungsten alloy, a nickel-phosphor alloy or a palladium-cobalt alloy. In addition, in other implementations, the outer surface of the probe structure 3 can have covering layers made of different materials and stacked thereon for forming a probe structure 3 with a multi-layer covering structure (not shown in the figures). The probe assembly U can further include a probe carrying seat B disposed on the space transformer T. It should be noted that the way of combining the probe carrying seat B and the transfer board 1 is well-known in the art and is not described herein.

Reference is made to FIG. 3 and FIG. 4. In the first embodiment of the instant disclosure, the dielectric structures 2 can be disposed between the second end portion 32 of the probe structure 3 and the conductive portions 11 of the transfer board 1. Therefore, the probe structures 3 and the conductive portions 11 are electrically insulated from each other. In addition, the dielectric structure 2 can have a first surface 21 (inner surface) directly contacting the probe structure 3 and a second surface 22 (outer surface) directly contacting the conductive portion 11. For example, the dielectric structure 2 can be made of an insulating material and have a resistivity of larger than or equal to $10^8$ Ωm, preferably larger than or equal to $10^9$ Ωm. In addition, the material of the dielectric structure 2 can include but not limited to polymer materials or ceramic materials, preferably, aluminum oxide ($Al_2O_3$). Moreover, in other implementations, the material of the dielectric structure 3 can be silicon nitride, yttrium oxide, titanium oxide, hafnium oxide, zirconium oxide or barium titanate. However, the instant disclosure is not limited thereto. Therefore, a capacitive area C can be formed by the dielectric structure 2 disposed between the probe structure 3 and the conductive portion 11 of the transfer board 1, thereby forming an embedded capacitor in the capacitive probe M in the probe assembly U.

It should be noted that since the dielectric structure 2 is disposed between the probe structure 3 and the conductive portion 11, and the dielectric structure 2 can enclose the second end portion 32 of the probe structure 3 for electrically insulating the probe structure 3 from the conductive portion 11, the conductive portion 11, the dielectric structure 2 and the probe structure 3 in the probe assembly U provided by the first embodiment of the instant disclosure can be considered as components connected in series. In addition, it should be noted that the dielectric structure 2 can be formed by a microelectromechanical system (MEMS) process, for example, by a lithography process and/or an electroplating process.

Figure 5:
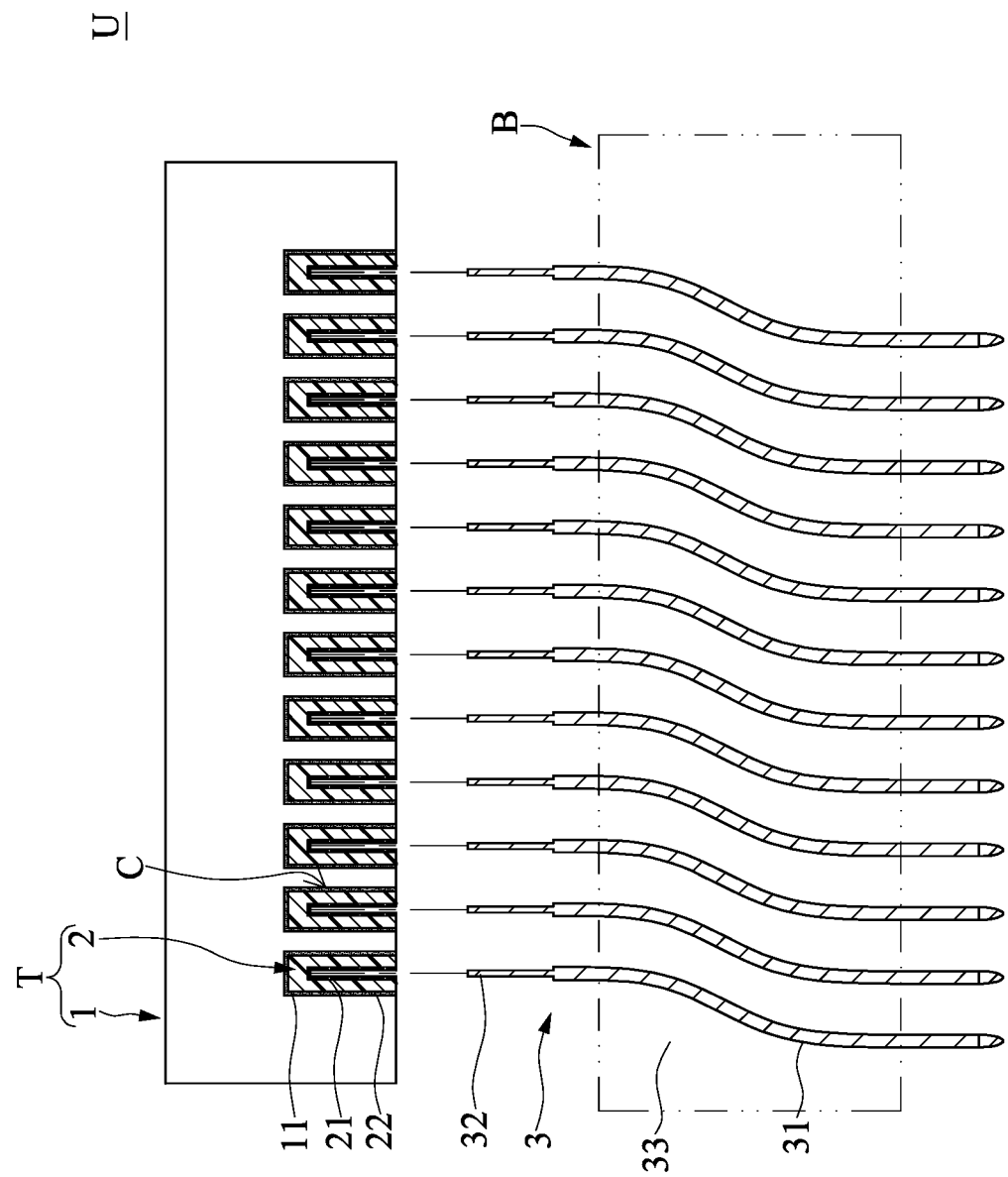
FIG. 5 is another schematic cross-sectional view of another implementation of the probe assembly of the first embodiment of the instant disclosure.

Reference is made to FIG. 5. FIG. 5 is a sectional schematic view of the probe assembly U of another implementation of the first embodiment. Specifically, in this implementation, the space transformer T further includes a plurality of conductive structures 4 disposed on the plurality of dielectric structures 2 respectively. Therefore, each of the dielectric structures 2 is located between the corresponding conductive portion 11 and the corresponding conductive structure 4. In addition, the plurality of probe structures 3 can be electrically connected to the plurality of conductive structures 4 respectively, and each of the conductive structures 4 and each of the dielectric structures 2 can be located between each of the conductive portions 11 and each of the probe structures 3. In other words, each of the dielectric structures 2 and the conductive structures 4 disposed thereon are located between the corresponding conductive portion 11 and the corresponding probe structure 3. Therefore, a capacitive area C can be formed between the conductive portion 11, the dielectric structure 2 and the conductive structure 4 for forming an embedded capacitor in the probe assembly U. In addition, in other implementations, the conductive structure 4 can be a part of the probe structure 3. Since the dielectric structure 2 is disposed between the conductive structure 4 and the conductive portion 11, the conductive structure 4 and the conductive portion 11 can be electrically insulated from each other, and the conductive portion 11, the dielectric structure 2 and the conductive structure 4 can together form a structure connected in series.

Second Embodiment

Figure 6:
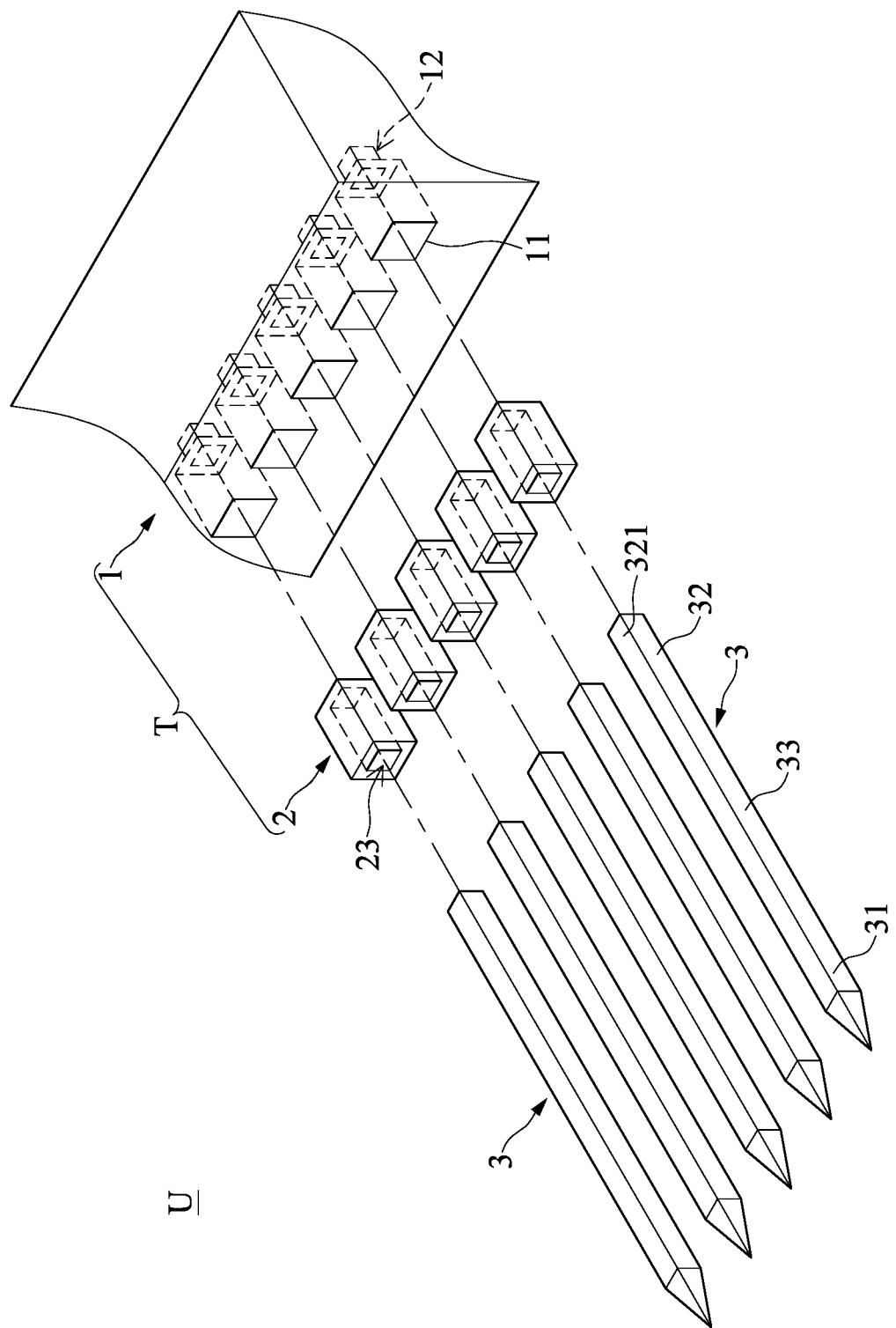
FIG. 6 is an exploded perspective view of a probe assembly of a second embodiment of the instant disclosure.
Figure 7:
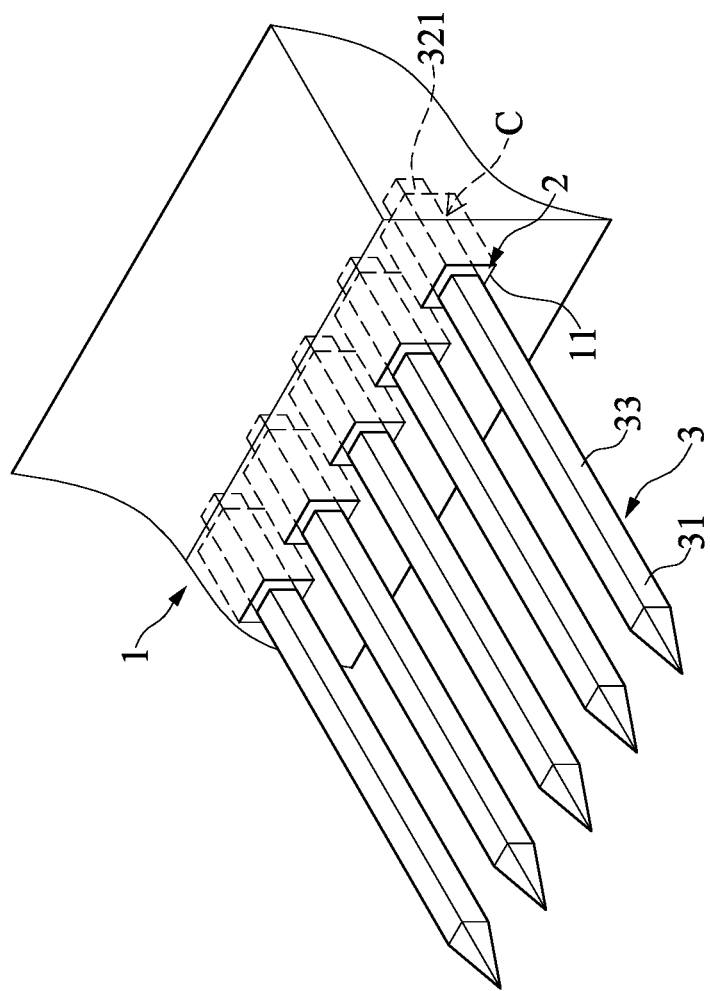
FIG. 7 is an assembly perspective view of the probe assembly of the second embodiment of the instant disclosure.
Figure 8:
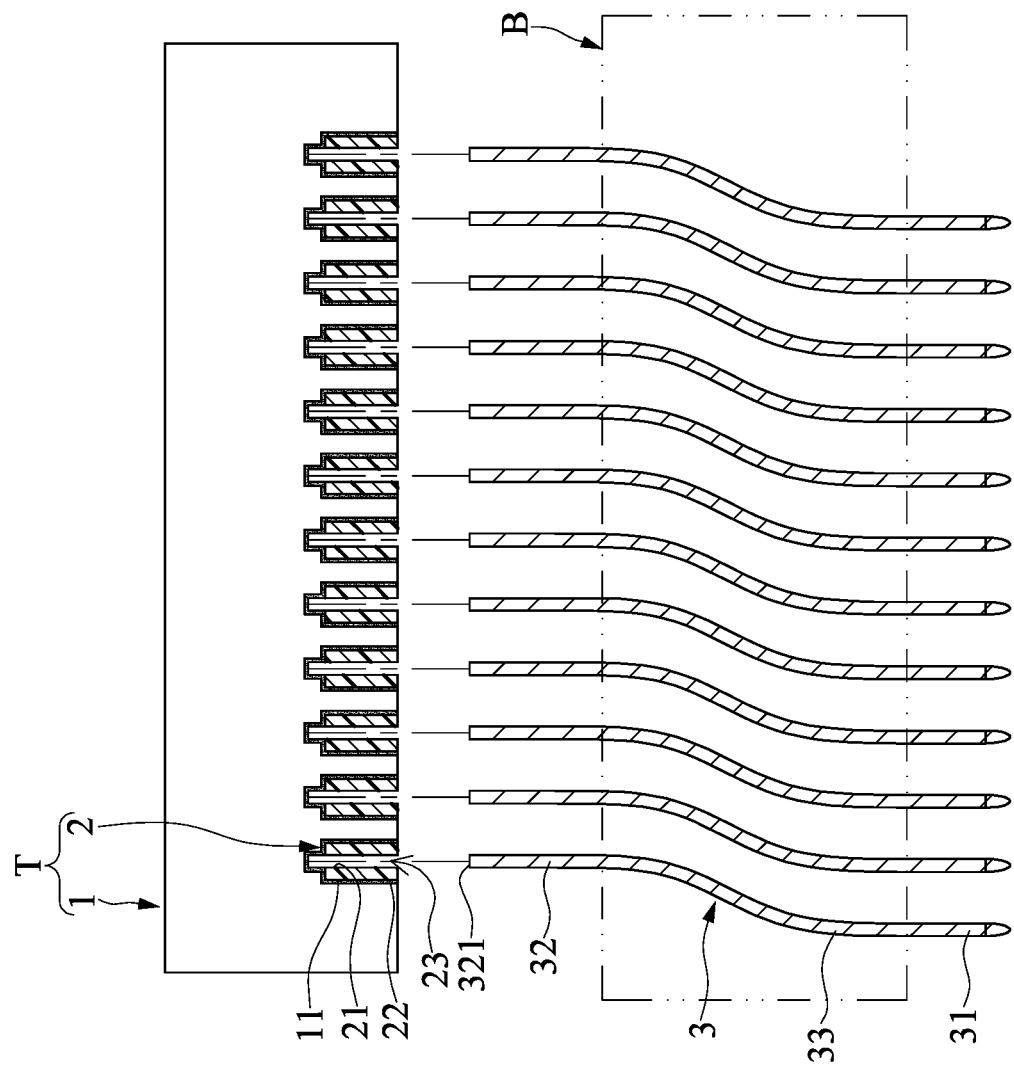
FIG. 8 is a sectional side schematic view of the probe assembly of the second embodiment of the instant disclosure.
Figure 9:
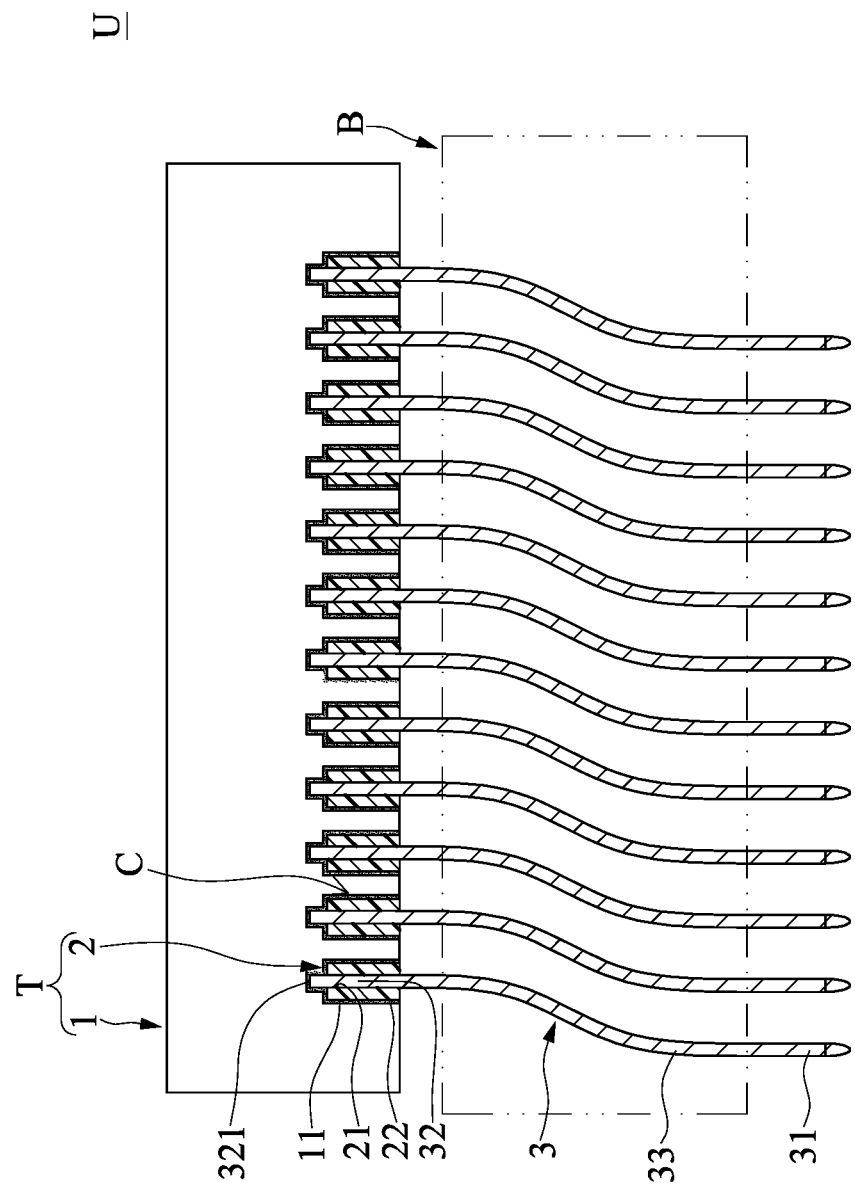
FIG. 9 is another sectional side schematic view of the probe assembly of the second embodiment of the instant disclosure.

Reference is made to FIG. 6 to FIG. 9. FIG. 6 and FIG. 7 are perspective views of the probe assembly U of the second embodiment of the instant disclosure, and FIG. 8 and FIG. 9 are sectional schematic views of the probe assembly U of the second embodiment. The second embodiment of the instant disclosure provides a probe assembly U and a space transformer T thereof. Comparing FIG. 9 to FIG. 4, the main difference between the second embodiment and the first embodiment is that the conductive portion 11, the dielectric structure 2 and the probe structure 3 of the probe assembly U provided by the second embodiment are connected in parallel. In addition, it should be noted that details of the transfer board 1, the dielectric structure 2 and the probe structure 3 in the probe assembly U provided by the second embodiment are similar to that of the previous embodiment and are not reiterated herein. In other words, the resistivity, the material and/or the shape of the conductive portion 11 of the transfer board 1, the dielectric structure 2, the probe structure 3 and the conductive structure 4 are similar to that of the previous embodiment and are not reiterated herein.

Specifically, as shown in FIG. 6 to FIG. 9, the second end portion 32 of the probe structure 3 has an exposed portion 321 corresponding to the dielectric structure 2, and the probe structure 3 is electrically connected to the conductive portion 11 of the transfer board 1 through the exposed portion 321. In addition, the dielectric structure 2 can have a first surface 21 contacting the probe structure 3 and a second surface 22 contacting the transfer board 1. In other words, the conductive portion 11, the dielectric structure 2 and the probe structure 3 in the probe assembly U provided by the second embodiment are connected in parallel. However, in other implementations, the exposed portion 321 can be located at the side of the second end portion and be a flat surface. In other words, the exposed portion 321 can be the exposed surface of the probe structure 3 corresponding to the dielectric structure 2 and be electrically connected to the conductive portion 11.

Figure 10:
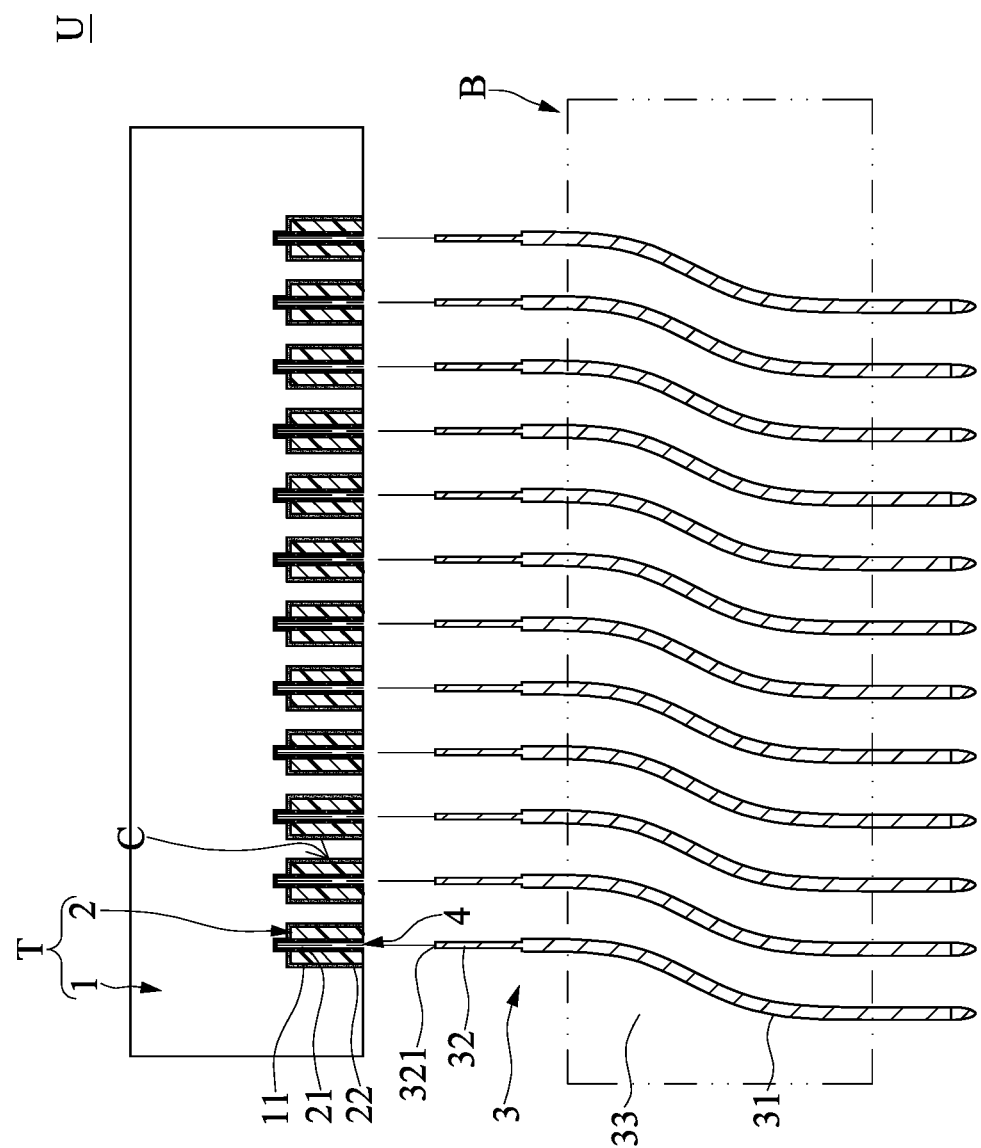
FIG. 10 is another sectional side schematic view of another implementation of the probe assembly of the second embodiment of the instant disclosure.

Reference is made to FIG. 10. FIG. 10 is a schematic cross-sectional view of another implementation of the probe assembly of the second embodiment of the instant disclosure. Specifically, comparing FIG. 10 to FIG. 9, in other implementations, the space transformer T can further include a plurality of conductive structures 4 disposed on each of the dielectric structures 2 respectively. Therefore, each of the dielectric structures 2 is located between each of the conductive portions 11 and each of the conductive structures 4. In addition, the plurality of probe structures 3 can be electrically connected to the plurality of conductive structures 4 respectively. Each of the conductive structures 4 and each of the dielectric structures 2 can be located between each of the conductive portions 11 and each of the probe structures 3 for forming an embedded capacitor in the probe assembly U.

Effectiveness of the Embodiments

One of the advantages of the instant disclosure is that the probe assembly U and the space transformer T thereof can optimize the target impedance value and increase the performance of the power delivery network based on the technical feature of "each of the dielectric structures 2 is disposed between the conductive portion 11 corresponding thereto and the probe structure 3 corresponding thereto". In addition, since the dielectric structure 2 is disposed between the probe structure 3 and the transfer board 1, the arrangement of the dielectric structure 2 can generate an embedded capacitor in the probe assembly U. Moreover, the capacitor in the probe assembly U and the space transformer T of the present disclosure can achieve the object of optimizing the target impedance value as compared to the structure of the existing art in which the transfer board (transfer substrate) is relatively far from the end to be measured, so that the parasitic effect can be improved.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A probe assembly, comprising:
    a space transformer including a transfer board and a plurality of dielectric structures, wherein the transfer board has a plurality of conductive portions, each of the dielectric structures being disposed on one side of the conductive portion corresponding thereto and contacting the conductive portion corresponding thereto; and
    a plurality of probe structures, each of the plurality of probe structures being disposed at one side of the dielectric structure corresponding thereto and contacting the dielectric structure corresponding thereto, wherein each of the dielectric structures is disposed between the conductive portion corresponding thereto and the probe structure corresponding thereto, and each of the probe structures has a first end portion, a second end portion corresponding to the first end portion, and a connecting portion connected between the first end portion and a second end portion;

wherein the probe structure and the conductive portion of the transfer board are electrically insulated from one another, and the dielectric structure has a first surface contacting the probe structure and a second surface contacting the conductive portion of the transfer board.

2. The probe assembly according to claim 1, wherein the dielectric structure has an accommodating space, the second end portions of each of the probe structures being disposed in the accommodating space of the dielectric structure corresponding thereto.

3. The probe assembly according to claim 1, wherein the second end portion of the probe structure has an exposed portion corresponding to the dielectric structure, and the probe structure is electrically connected to the conductive portion of the transfer board through the exposed portion.

4. The probe assembly according to claim 1, wherein the probe structure has a resistivity of less than $5 \times 10^2$ Ωm.

5. The probe assembly according to claim 1, wherein the plurality of conductive portions of the transfer board has a resistivity of less than $5 \times 10^2$ Ωm.

6. The probe assembly according to claim 1, wherein the dielectric structure has a resistivity of more than or equal to $10^8$ Ωm.

7. The probe assembly according to claim 1, further comprising: a probe carrying seat disposed on the space transformer.

8. The probe assembly according to claim 1, wherein the space transformer further includes a plurality of conductive structures disposed on the plurality of dielectric structures respectively, so that each of the dielectric structures is located between the conductive portion corresponding thereto and the conductive structure corresponding thereto.

9. The probe assembly according to claim 8, wherein the plurality of probe structures are electrically connected to the plurality of conductive structures respectively, and each of the dielectric structures and the conductive structures disposed thereon are located between the conductive portion corresponding thereto and the probe structure corresponding thereto.

10. A space transformer, a plurality of probe structures being electrically connected to the space transformer respectively, the space transformer comprising: a transfer board having a plurality of conductive portions; and a plurality of dielectric structures disposed in the plurality of conductive portions respectively, each of the dielectric structures being located between the conductive portion corresponding thereto and the probe structure corresponding thereto, wherein the probe structure and the conductive portion of the transfer board are electrically insulated from one another, and the dielectric structure has a first surface contacting the probe structure and a second surface contacting the conductive portion of the transfer board.

11. The space transformer according to claim 10, further comprising: a plurality of conductive structures disposed on the plurality of dielectric structures respectively, wherein each of the dielectric structures is located between the conductive structure corresponding thereto and the conductive portion corresponding thereto.

* * * * *